(12) United States Patent
Mayer et al.

(10) Patent No.: US 8,129,789 B2
(45) Date of Patent: Mar. 6, 2012

(54) CURRENT CONTROL USING THERMALLY MATCHED RESISTORS

(75) Inventors: Alexander Mayer, Treffen (AT); Guenter Herzele, Techelsberg (AT); Andreas Tschmelitsch, Villach (AT); Matthias Kogler, Maria Elend (AT)

(73) Assignee: Infineon Technologies AG, Neubiberg (DE)

( * ) Notice: Subject to any disclaimer, the term of this patent is extended or adjusted under 35 U.S.C. 154(b) by 97 days.

(21) Appl. No.: 12/790,562

(22) Filed: May 28, 2010

(65) Prior Publication Data

US 2011/0291741 A1 Dec. 1, 2011

(51) Int. Cl.
*H01L 27/06* (2006.01)
(52) U.S. Cl. ................ 257/358; 257/E27.095
(58) Field of Classification Search .............. 257/300, 257/358, E27.095, 365, 758; 361/56
See application file for complete search history.

(56) References Cited

U.S. PATENT DOCUMENTS

| | | | | |
|---|---|---|---|---|
| 7,470,957 B2* | 12/2008 | Gossner | ............. | 257/355 |
| 7,495,872 B2* | 2/2009 | Irino | ............. | 361/54 |
| 7,724,068 B1* | 5/2010 | Smith et al. | ............. | 327/513 |
| 7,943,923 B2* | 5/2011 | Gidon | ............. | 257/5 |
| 2003/0222295 A1* | 12/2003 | Lin | ............. | 257/300 |
| 2006/0151881 A1* | 7/2006 | Yamada | ............. | 257/758 |
| 2006/0157854 A1* | 7/2006 | Takewaki et al. | ............. | 257/758 |
| 2008/0019165 A1* | 1/2008 | Lin et al. | ............. | 365/102 |
| 2009/0051405 A1* | 2/2009 | Kadow et al. | ............. | 327/390 |
| 2009/0283911 A1* | 11/2009 | Tsai et al. | ............. | 257/758 |
| 2010/0207206 A1* | 8/2010 | Krischke et al. | ............. | 257/337 |

OTHER PUBLICATIONS

Barrault, M., et al., "Post-Arc Current Measurement Down to the Ten Milliamperes Range," IEEE Transactions on Power Delivery, Oct. 1993, pp. 1782-1788, vol. 8, No. 4.

* cited by examiner

*Primary Examiner* — Nathan Ha
(74) *Attorney, Agent, or Firm* — Slater & Matsil, L.L.P.

(57) ABSTRACT

A semiconductor chip includes a semiconductor body having an upper surface. At least one power semiconductor component is integrated in the semiconductor chip together with other circuitry. Two or more vertically spaced metallization layers are arranged on the surface of the semiconductor body. The top metallization layer includes terminals establishing an electrical connection to load terminals of the power semiconductor component. A current measurement resistor is formed by a portion of the top metallization layer for sensing a load current of the power semiconductor component. A temperature measurement resistor is formed by a portion of at least one of the vertically spaced metallization layers, electrically isolated from current measurement resistor but thermally coupled thereto such that the current measurement resistor and the temperature measurement resistor have the same temperature.

20 Claims, 2 Drawing Sheets

CURRENT CONTROL USING THERMALLY MATCHED RESISTORS

TECHNICAL FIELD

The present invention relates to integrated circuits and related methods for current control and, in particular embodiments, to integrated circuits providing current limitation functionality for power semiconductor switches.

BACKGROUND

Temperature independent current-control, in particular, a temperature independent current limitation, in integrated circuits may be a formidable task when standard solutions are inappropriate for being too expensive (such as, e.g., concepts using band-gap references because such circuits entail too many components in order to be integrated within a given chip area or at given costs) or too inaccurate (such as, e.g., concepts employing so-called sense-FETs for providing a current sense signal).

Metal shunt resistors are commonly used in integrated power semiconductor components. When connected in series to the load path of the power semiconductor component the voltage drop across the shunt may be used as a current sense signal and further processed, for example, in a current control circuit (current limiter, current regulator, etc.).

However, metal shunt resistors typically have a significant (positive) temperature coefficient. Pure metals typically exhibit temperature coefficients of 0.4 percent per Kelvin. Thus, metal shunts can not be used when a precise measurement is required within a large temperature range without considering the temperature dependent change of resistance. For this reason alloys have been developed that exhibit a temperature coefficient close to zero. However such alloys can not processed in integrated circuits where mainly pure metals such as aluminum, copper and gold are processed to form metallization layers.

There is a general need for a precise current control, in particular, a precise current limitation, in integrated circuits. The required current measurement components and circuitry should be producible with well-established semiconductor production processes.

SUMMARY OF THE INVENTION

A semiconductor chip is disclosed. The chip comprises a semiconductor body having an upper surface. At least one power semiconductor component is integrated in the semiconductor chip together with other circuitry. Two or more vertically spaced metallization layers are arranged on the surface of the semiconductor body. Each metallization layer has a thickness less than 1000 nanometers. One top metallization layer has a thickness higher than 1000 nanometers. The top metallization layer comprises terminals establishing an electrical connection to load terminals of the power semiconductor component. A current measurement resistor is formed by a portion of the top metallization layer for sensing a load current of the power semiconductor component. A temperature measurement resistor is formed by a portion of at least one of the vertically spaced metallization layers, electrically isolated from current measurement resistor but thermally coupled thereto such that the current measurement resistor and the temperature measurement resistor have the same temperature. The portion(s) of the metallization layer(s) form the temperature measurement resistor.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings.

DETAILED DESCRIPTION OF ILLUSTRATIVE EMBODIMENTS

Figure 1:
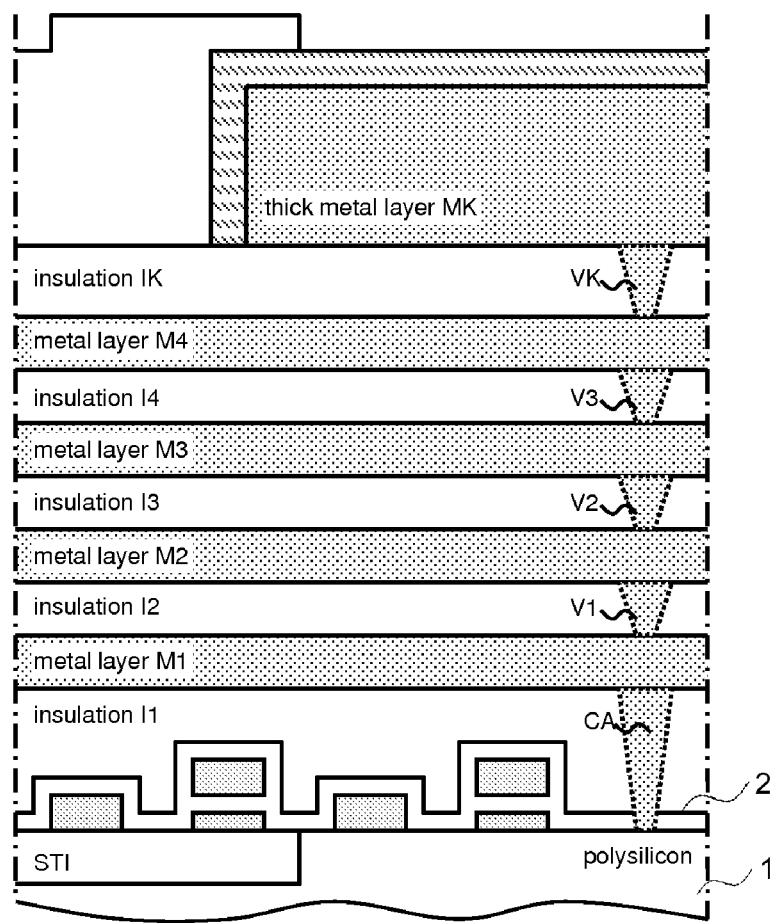
FIG. 1 illustrates a semiconductor chip with a semiconductor body and a number of vertically spaced metallization layers arranged on the surface of the semiconductor body.

In the following disclosure a semiconductor chip is described an example of which is illustrated in FIG. 1. The chip illustrated in FIG. 1 comprises a semiconductor body 1 in which at least one power semiconductor component is integrated. Such power semiconductor components may be, for example, any type of controllable semiconductor switches (MOSFETs, IGBTs, BJTs), diodes, thyristors other like.

One or more vertically spaced metallization layers M1, M2, M3, M4 are arranged on a top of an upper surface of the semiconductor body 1. These metallization layers M1, M2, M3, M4 are structured so as to connect the power semiconductor component(s) and other components integrated in the semiconductor body 1 in order to form a desired electronic circuit. The metallization layers M1, M2, M3, and M4 may be relatively thin since most of the components integrated in the semiconductor body 1 are low power components and thus the currents flowing through the metallization layers are low. For example, the thickness of the metallization layer M1, M2, M3, or M4 is below 1000 nm or even below 500 nm. In an exemplary embodiment the metallization layers have a thickness of 320 nm.

In order to establish an electric contact to the power semiconductor component a top metallization layer MK is provided having a thickness more than 10 times higher (e.g., about 10 to 20 times higher) than the other metallization layers M1 to M4 in order to transport the high currents (up to several amperes) flowing through the power semiconductor component(s) integrated in the semiconductor body 1. For example, the top metallization layer MK may have a thickness higher than the 1000 nm, especially higher than 2500 nm or even higher than 5000 nm. In an exemplary embodiment a top metallization layer has a thickness of 5000 nm. However, the top metallization layer MK may even be thicker dependent on the maximum expected current flow through the power semiconductor component(s).

In order to provide information about the load current $i_L$ flowing through the power semiconductor component a part of the thick top metallization layer MK is structured so as to form a current measurement resistor (shunt resistor $R_{SHUNT}$). The voltage drop across this current measurement resistor $R_{SHUNT}$ may be used as a current sense signal representing the load current $i_L$ through the power semiconductor component. However, the voltage drop across the current measurement resistor $R_{SHUNT}$ does not only depend on the load current $i_L$ flowing through the power semiconductor component, but also on the temperature of the current measurement resistor $R_{SHUNT}$, wherein the temperature may vary dependent on the current flowing through the resistor.

In order to provide a precise current measurement signal, the component of the current signal (i.e., the voltage drop across the current measurement resistor) that is a result of a temperature change relative to an initial temperature (or standard temperature) has to be compensated for. For this reason, a temperature measurement resistor $R_M$ is formed by a portion of at least one of the thin, vertically spaced metallization layers M1, M2, M3, or M4 which are electrically isolated from the current measurement resistor $R_{SHUNT}$ but thermally coupled thereto such that the current measurement resistor $R_{SHUNT}$ and the temperature measurement resistor $R_M$ have the same temperature. As the measurement current $i_M$ supplied to the temperature measurement resistor $R_M$ has to be much lower than the load current $i_L$, the temperature measurement resistor can be formed in one of the thin metallization layers M1 to M4 arranged between the thick top metallization layer MK and the semiconductor surface. For example, the temperature measurement resistor is formed in one of the thin metallization layers M1 to M4 and located under the current measurement resistor $R_{SHUNT}$ so as to provide a good thermal coupling of the resistors $R_M$ and $R_{SHUNT}$. This ensures that the temperature of both resistors is practically the same all the time.

The arrangement of the metallization layers M1, M2, M3, M4, and MK forming the temperature measurement resistor $R_M$ and the current measurement resistor $R_{SHUNT}$, respectively, is illustrated in FIG. 1. FIG. 1 illustrates a part of a semiconductor body 1 with a top surface 2 on which a stack of vertically spaced metallization layers M1, M2, M3, and M4 is arranged essentially parallel to the surface 2. An isolation layer I1 is arranged between the bottom metallization layer M1 and the surface 2 of the semiconductor body 1. Isolation layers I2, I3, and I4 separate the metallization layers M1, M2, M3 and M4 from each other. These metallization layers are, as explained above, relatively thin, having thicknesses below 500 nm and are structured so as to connect the low power components integrated in the semiconductor body 1 in accordance with a desired circuit plan. Thereby the circuit components integrated in the semiconductor body 1 are electrically contacted by means of contacts ("vias") CA, V1, V2, and V3, wherein the contact CA provides an electric contact between the bottom metallization layer M1 and the semiconductor body 1 and the contact V1, V2, and V3 providing an electric contact ("via") between the metallization layers M1 to M4.

FIG. 1 is a schematic view of a cross section through the chip. In order to keep the view simple only one contact CA, V1, V2, V3, VK is shown between each pair of metallization layer. However, a plurality of contacts or vias may be arranged between the layers in order to establish the desired electronic circuitry. The top metallization layer MK is arranged on the metal layer M4 and separated therefrom by insulation layer IK which is, for example an oxide, layer. The top metallization layer is used to establish electric contact with the power semiconductor components integrated in the semiconductor body 1 by means of power via(s) VK. In order to be able to carry the high currents through the power semiconductor components the top metallization layer MK is rather thick compared to other metallization layers M1 to M4 as already mentioned above.

Figure 2:
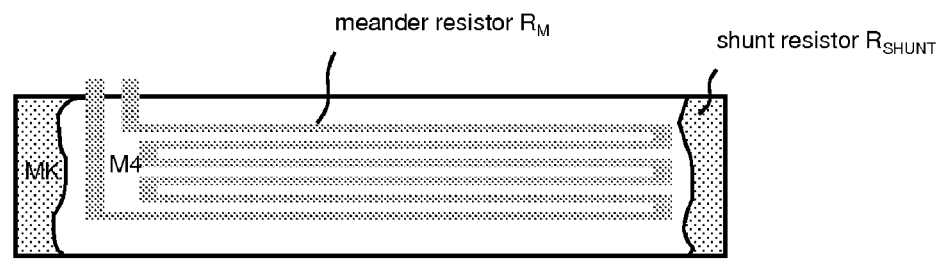
FIG. 2 illustrates an example of a high current shunt resistor formed in a relatively thick top metallization layer of the semiconductor chip and a meander-shaped second resistor formed in the metallization layer directly below the shunt resistor in order to ensure a thermal coupling between the two resistors.

FIG. 2 illustrates one exemplary implementation of the above-mentioned measurement resistors $R_{SHUNT}$, $R_M$ formed in the thick top metallization layer MK and the metal layer M4, respectively, whereby the metallization layer M4 is arranged directly below the metal layer MK and isolated therefrom by insulation layer IK. FIG. 2 is a top view showing the surface of thick metal layer MK, whereby the thick metal layer MK and the insulation (e.g., oxide) layer IK are interrupted in order to allow a view of the (patterned) metal layer M4 and the temperature measurement resistor $R_M$ formed in this metal layer. In order to provide a sufficient high resistance the portion of the metal layer M4 forming the temperature measurement resistor $R_M$ is patterned to form a meander shape as shown in FIG. 2. Alternatively, a spiral shape may be appropriate to achieve the same result. Directly above the temperature measurement resistor $R_M$ the shunt resistor $R_{SHUNT}$ is formed in the thick metal layer MK as a solid rectangular strip line. As both resistors $R_M$, $R_{SHUNT}$ are only separated by insulation layer IK the resistors $R_M$, $R_{SHUNT}$ are thermally coupled and essentially always have the same temperature.

In accordance with one example, the shunt resistor $R_{SHUNT}$ may have a resistance of 50 mΩ for measuring a maximum load current of 2.4 amperes. A rectangular portion of the thick metal layer MK may be used to form the resistor, the width W of the rectangular strip line being 30 μm and the length L thereof being 235 μm. The temperature measurement resistor $R_M$ is formed in a rectangular portion of the same size in the metallization layer M4 directly below the shunt resistor $R_{SHUNT}$. In order to receive a sufficiently high resistance of, for example, 9.843 ohms a number of, for example, 75 thin strip lines each having a width of 0.5 μm and a length of 475 μm are connected so as to form a meander shaped strip line as illustrated in FIG. 2.

Figure 3:
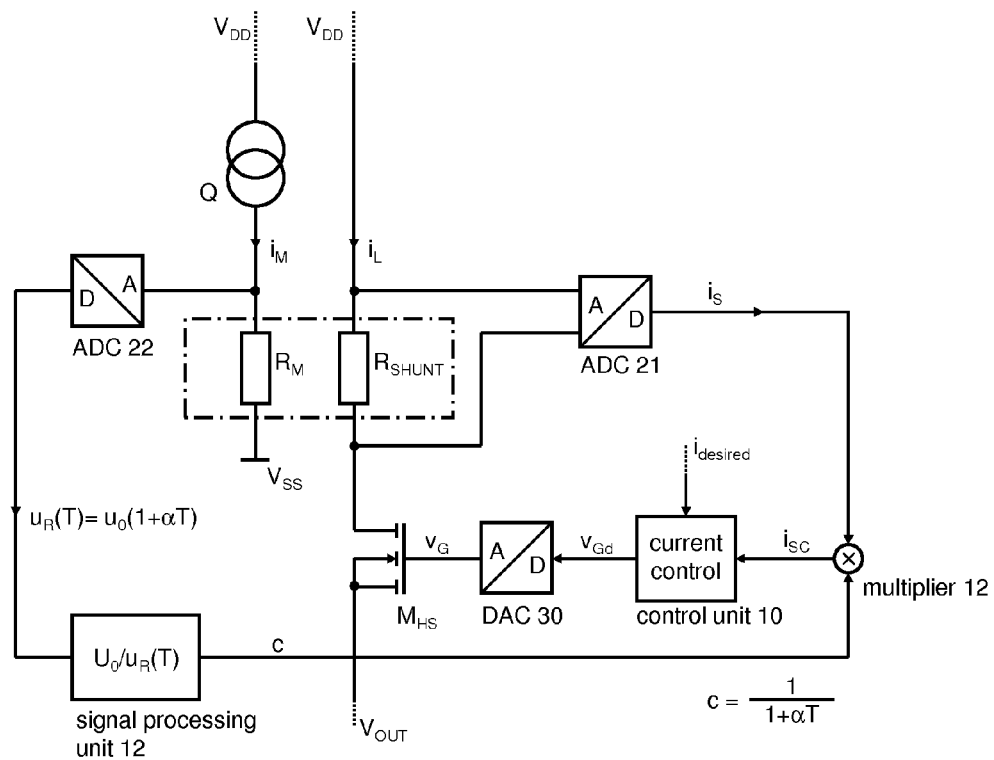
FIG. 3 illustrates, as a block circuit diagram, the basic structure for digital current control of the load current of a power transistor employing the thermally coupled resistors shown in FIG. 2.

The current measurement resistor $R_{SHUNT}$ as well as the temperature measurement resistor $R_M$ may be part of the circuit arrangement illustrated in FIG. 3 which is used to process the measurement signals so as to provide the temperature independent current sense signal and to generate an appropriate control signal for driving the power semiconductor component for controlling or regulating the current flow through it.

In order to allow for current measurement the shunt resistor $R_{SHUNT}$ has to be connected in series to the load current path of the power semiconductor component which is, in the example of FIG. 3, a MOSFET $M_{HS}$. Further, the temperature measurement resistor $R_M$ is provided with a test current $i_M$ generated by a constant current source Q. The voltage drop across the shunt resistor $R_{SHUNT}$ is digitized using the analog-to-digital converter 21 which provides a digital current signal $i_S$. It should be noted that the digital current signal $i_S$, which represents the load current $i_L$ through the power semiconductor component $M_{HS}$, includes a temperature dependent measurement error. Since such a measurement error is a systematic error it can be compensated for if the temperature is known or can be precisely determined by measurement.

The voltage drop across the temperature measurement resistor $R_M$ represents the temperature of the shunt resistor $R_{SHUNT}$ since both resistors are thermally coupled as described above with reference to FIGS. 1 and 2. The voltage drop across the resistor $R_M$ is digitized by analog-digital-converter 22 which provides a digital temperature value $u_R$ which can generally be denoted as $$U_R(T) = u_0 \cdot (1 + \alpha T) \tag{1}$$

where $u_0$ is the voltage across the temperature measurement resistor at a given reference temperature, α is the temperature coefficient, and T is the temperature deviation from the reference temperature corresponding to the voltage drop $u_0$. The digital-to-analog converters 21, 22 allow for digital current control of the load current $i_L$ flowing through the power semiconductor component $M_{HS}$.

The analog-to-digital converter 22 may be regarded as part of circuitry coupled to the temperature measurement resistor $R_M$, wherein the circuitry is designed to provide a correction signal c dependent on the temperature T of the current measurement resistor $R_{SHUNT}$. The correction factor is reciprocal of the factor that describes the rise of resistance of the shunt resistor $R_{SHUNT}$ due to an increase of temperature T. As can be seen from equation (1) the factor describing the impact of temperature on the resistance equals $(1+\alpha T)$, where T describes temperature deviation from an initial temperature or a standard temperature (e.g., 20° C.). In this analysis it is assumed that both resistors $R_M$, $R_{SHUNT}$ have essentially the same temperature coefficient.

Consequently, the correction factor is $1/(1+\alpha T)$, whereby the correction factor c may be calculated as $u_0/U_R(T)$. The latter calculation (division) may be done in the signal processing unit 12 receiving the digitized voltage drop $U_R(T)$ across the temperature measurement resistor $R_M$. The signal processing unit 12 may be also be regarded as part of the above mentioned circuitry for providing the correction signal c. It should be noted that the division $u_0/U_R(T)$ (see also equation 2) may be substituted by MAC-operations (where multiply-accumulate is abbreviated as MAC) by employing an appropriate first order (or second order, or generally $n^{th}$ order) Taylor-series expansion.

The digitized current sense signal $i_S$ may be multiplied with the correction factor $c=(1+\alpha T)^{-1}$ yielding the corrected current sense signal $i_{SC}=i_S \cdot c$ whose value is independent from the actual temperature of the shunt resistor $R_{SHUNT}$ as can easily be seen from $$i_{SC} \sim R_{SHUNT} \cdot i_L \cdot (1+\alpha T)^{-1} = R_{SHUNT,0} \cdot (1+\alpha T) \cdot i_L \cdot (1+\alpha T)^{-1} = R_{SHUNT,0} \cdot i_L, \qquad (2)$$

whereby $R_{SHUNT,0}$ is the (a priori known) resistance of the shunt resistor at the initial or at a well-defined standard reference temperature.

The corrected digital current sense signal $i_{SC}$ is fed into control unit 10 which generates a digital driver signal $v_{Gd}$ that is fed to the digital-to-analog converter 30 which provides a corresponding analog driver signal $v_G$ supplied to a control terminal of the semiconductor switch $M_{HS}$ thus closing the control loop. The analog digital converter 21, the digital-to-analog converter 30, the control unit 10 as well as the multiplier 12 may be regarded as circuitry coupled to the current measurement circuit $R_{SHUNT}$ and configured to combine the correction signal c as well as the digitized current measurement signal $i_S$ so as to compensate for signal components in the current sense signal $i_S$ which are due to temperature variations as explained above.

The control law used in the control unit 10 may vary dependent on the actual application. Further, a desired load current $i_{desired}$ may be supplied to the control unit 10 and processed therein. For current limitation purposes the actual temperature compensated digitized current sense signal $i_{SC}$ may be compared to a threshold value and the driver signal $v_G$ may be reduced as soon as the actual load current exceeds the threshold so as to keep the load current $i_L$ below the threshold value. However, different control laws may be applicable dependent on the use of the circuit arrangement.

Figure 4:
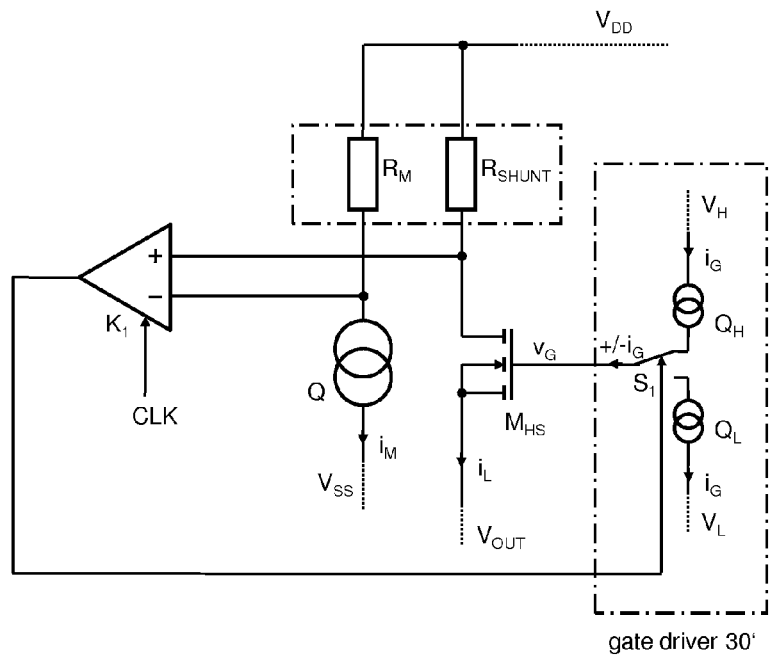
FIG. 4 is another circuit diagram illustrating an alternative exemplary current control loop.

FIG. 4 is a simplified block diagram illustrating an alternative digital current control loop in accordance with a further example of the present invention. As in the example of FIG. 3, the measurement resistor $R_M$ is supplied with a reference current $i_M$ (constant current source Q). Using the control loop of FIG. 4, which includes the comparator unit $K_1$ and the gate driver unit 30' connected downstream of the comparator unit $K_1$, allows for controlling the load current $i_L$, that flows through the load transistor $M_{HS}$, such that it obeys the equation $$i_M \cdot R_M = i_L \cdot R_{SHUNT}, \qquad (3)$$

whereby $R_M$ is temperature dependent in accordance with the temperature coefficient $\alpha$, that is $R_M=R_{M0} \cdot (1+\alpha \cdot T)$, $R_{M0}$ being a nominal resistance at a temperature deviation T=0 (see equation 1). It follows from equation 3 that the resistance ratio $R_M/R_{SHUNT}$ equals the current ratio $i_L/i_M$, whereby the ratios do not depend on temperature as the temperature dependent factors $(1+\alpha \cdot T)$ of $R_M$ and $R_{SHUNT}$ cancel out.

The comparator $K_1$ implements a kind of bang-bang control for regulating the load current $i_L$. The output of the comparator $K_1$ switches to a low level as soon as the right hand side of equation 3 is greater than the left hand side ($i_M \cdot R_M < i_L \cdot R_{SHUNT}$). As a consequence, the gate capacitor $C_{GS}$ of the load transistor $M_{HS}$ is discharged and thus the load current decreases. Similarly, the output of the comparator $K_1$ switches to a high level as soon as the right hand side of equation 3 is lower than the left hand side ($i_M \cdot R_M < i_L \cdot R_{SHUNT}$). As a consequence, the gate capacitor $C_{GS}$ of the load transistor $M_{HS}$ is charged and thus the load current increases again. As long as the bang-bang controller (i.e., the comparator $K_1$) switches fast enough, the load current follows the rule given in equation 3. In a digital implementation the comparator $K_1$ may be clocked so that it can only change its output in accordance with a clock signal CLK. The amount of electrical charge added or removed from the gate capacitor $C_{GS}$ during one clock cycle should be small compared to the total charge stored in the gate capacitor $C_{GS}$ in order to ensure proper current control.

The gate driver unit 30' may be implemented in different ways. In a simple implementation the gate driver comprises essentially a gate resistor coupled between the comparator output and the gate of transistor $M_{HS}$. In the example of FIG. 4 the gate driver unit 30' comprises switchable current sources $Q_H$ and $Q_L$ (switch $S_1$) so as to provide a switchable gate current of $+i_G$ or $-i_G$, respectively, dependent on the comparator output.

It should be noted that the current source Q providing a reference current $i_M$ may be replaced by a voltage source providing a reference voltage. In this case the current flowing through the measurement resistor $R_M$ has to be measured separately which entails further circuit components and results in a more complicated control loop circuit although the operating principle is the same.

In the example of FIG. 4 the above-mentioned first circuitry (see FIG. 3), which is coupled to the temperature measurement resistor $R_M$ and designed to provide a correction signal c dependent on the temperature of the current measurement resistor $R_M$, simply includes the reference current source Q and the line connecting the resistor $R_M$ with the inverting input of the comparator $K_1$. In this example the voltage present at the inverting comparator input may be regarded as correction signal c.

Further, the above mentioned second circuitry (see FIG. 3), which is coupled to the current measurement resistor $R_{SHUNT}$ and designed to provide a second signal representing the load current $i_L$ flowing through the resistor $R_{SHUNT}$, simply includes the line connecting the resistor $R_{SHUNT}$ with the non-inverting input of the comparator $K_1$. Finally, the second circuitry includes the comparator unit $K_1$ for implementing the above mentioned bang-bang-control, so as to compensate for signal components in the current signal (i.e., the voltage at the non-inverting comparator input) which are due to temperature variations.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

What is claimed is:

1. A semiconductor chip comprising:
   a semiconductor body having an upper surface;
   at least one power semiconductor component and other circuitry disposed adjacent the upper surface of the semiconductor body;
   a plurality of vertically spaced metallization layers arranged over the surface of the semiconductor body, each metallization layer having a thickness less than 1000 nanometers;
   a top metallization layer having a thickness greater than 1000 nanometers, the top metallization layer comprising terminals establishing an electrical connection to load terminals of the power semiconductor component;
   a current measurement resistor comprising a portion of the top metallization layer for sensing a load current of the power semiconductor component; and
   a temperature measurement resistor comprising a portion of at least one of the vertically spaced metallization layers, the temperature measurement resistor electrically isolated from but thermally coupled to the current measurement resistor such that the current measurement resistor and the temperature measurement resistor have substantially the same temperature.

2. The semiconductor chip of claim 1, wherein the current measurement resistor comprises a portion of the top metallization layer and is located above the temperature measurement resistor.

3. The semiconductor chip of claim 1, wherein the temperature measurement resistor comprises a portion of a metallization layer that is arranged directly under the top metallization layer such that the temperature measurement resistor and the current measurement resistor are separated by an insulation layer without any intervening metallization layers.

4. The semiconductor chip of claim 1, wherein the portion of the metallization layer, which forms the temperature measurement resistor, comprises a meander-shaped strip line.

5. The semiconductor chip of claim 1 further comprising:
   first circuitry coupled to the temperature measurement resistor and designed to provide a correction signal dependent on the temperature of the current measurement resistor; and
   second circuitry coupled to the current measurement resistor and designed to provide a second signal representing the load current flowing through the current measurement resistor, the second circuitry receiving the correction signal and being further designed to combine the correction signal and the second signal so as to compensate for signal components in the current signal which are due to temperature variations.

6. The semiconductor chip of claim 5, wherein:
   the first circuitry comprises:
      a current source providing a test current to the temperature measurement resistor thus generating a temperature dependent voltage drop there across; and
      a first analog-to-digital converter for generating a digital representation of the correction signal, and
   the second circuitry comprises:
      a second analog-to-digital converter for generating a digital representation of the current measurement signal; and
      a calculation unit for combining the correction signal and the current measurement signal, so as to provide a temperature independent current signal.

7. The semiconductor chip of claim 6 further comprising:
   driver circuitry for generating a driver signal supplied to the power semiconductor component for regulating the current flow through it; and
   a controller receiving the temperature independent current signal, the controller designed to generate the driver signal dependent from the temperature independent current signal according to a predefined control law.

8. The semiconductor chip of claim 7, wherein the control law is adapted for limiting the current through the power semiconductor component to a maximum value.

9. The semiconductor chip of claim 5, wherein:
   the first circuitry comprises a current source providing a test current to the temperature measurement resistor thus generating a temperature dependent voltage drop thereacross that forms the correction signal; and
   the second circuitry comprises a comparator unit combining the correction signal and the second signal, the comparator output being coupled to a control terminal of the power semiconductor component.

10. The semiconductor chip of claim 9, where the comparator unit forms a bang-bang controller driving the power semiconductor component in a way that the load current is a temperature independent function of the test current.

11. The semiconductor chip of claim 1, wherein each metallization layer of the plurality vertically spaced metallization layers has a thickness less than 500 nanometers.

12. The semiconductor chip of claim 1, wherein the plurality of vertically spaced metallization layers comprises four metallization layers.

13. The semiconductor chip of claim 1, wherein the top metallization layer is 10 to 20 times thicker than any of the metallization layers of the plurality of vertically spaced metallization layers.

14. The semiconductor chip of claim 1, wherein the top metallization layer has a thickness greater than 2500 nm.

15. A semiconductor chip comprising:
   a semiconductor body having an upper surface;
   at least one power semiconductor component adjacent the upper surface of the semiconductor body;
   a first metallization layer overlying the upper surface of the semiconductor body;
   a second metallization layer overlying the first metallization layer, the second metallization layer being at least ten times thicker than the second metallization layer, the top metallization layer comprising terminals establishing an electrical connection to load terminals of the power semiconductor component;

an insulation region between the first metallization layer and the second metallization layer wherein the first metallization layer and the second metallization layer are separated by the insulation layer without any intervening metallization layers;

a current measurement resistor comprising a portion of the second metallization layer and configured to sense a load current of the power semiconductor component; and a temperature measurement resistor comprising a portion of the first metallization layer, the temperature measurement resistor electrically isolated from but thermally coupled to the current measurement resistor.

16. The semiconductor chip of claim 15, wherein the current measurement resistor and the temperature measurement resistor are arranged so as to have substantially the same temperature during operation of the semiconductor chip.

17. The semiconductor chip of claim 15 further comprising:

first circuitry coupled to the temperature measurement resistor and designed to provide a correction signal dependent on the temperature of the current measurement resistor; and second circuitry coupled to the current measurement resistor and designed to provide a second signal representing the load current flowing through the current measurement resistor.

18. The semiconductor chip of claim 17, wherein the second circuitry is designed to receive the correction signal and to combine the correction signal and the second signal so as to compensate for signal components in the current signal that are due to temperature variations.

19. The semiconductor chip of claim 18, wherein:

the first circuitry comprises:
    a current source providing a test current to the temperature measurement resistor thus generating a temperature dependent voltage drop there across; and
    a first analog-to-digital converter for generating a digital representation of the correction signal, and the second circuitry comprises:
    a second analog-to-digital converter for generating a digital representation of the current measurement signal; and
    a calculation unit for combining the correction signal and the current measurement signal, so as to provide a temperature independent current signal.

20. The semiconductor chip of claim 18, wherein:

the first circuitry comprises a current source providing a test current to the temperature measurement resistor thus generating a temperature dependent voltage drop thereacross that forms the correction signal; and the second circuitry comprises a comparator unit combining the correction signal and the second signal, the comparator output being coupled to a control terminal of the power semiconductor component.

* * * * *